(12) United States Patent
Kosaka et al.

(10) Patent No.: US 7,632,741 B2
(45) Date of Patent: Dec. 15, 2009

(54) METHOD FOR FORMING ALGAN CRYSTAL LAYER

(75) Inventors: Kei Kosaka, Nagoya (JP); Shigeaki Sumiya, Handa (JP); Tomohiko Shibata, Akita (JP)

(73) Assignee: NGK Insulators, Ltd., Nagoya (JP)

( * ) Notice: Subject to any disclaimer, the term of this patent is extended or adjusted under 35 U.S.C. 154(b) by 4 days.

(21) Appl. No.: 12/051,138

(22) Filed: Mar. 19, 2008

(65) Prior Publication Data

US 2008/0233721 A1   Sep. 25, 2008

(30) Foreign Application Priority Data

Mar. 23, 2007   (JP)   ............................. 2007-076490

(51) Int. Cl.
*H01L 21/20* (2006.01)
*H01L 21/36* (2006.01)

(52) U.S. Cl. .................... 438/478; 438/492; 257/77; 257/190; 257/E29.104; 257/E21.108

(58) Field of Classification Search .................... 257/14, 257/103, 77, 190, E29.104, E29.091, E21.09, 257/E21.108; 117/952; 438/478, 493
See application file for complete search history.

(56) References Cited

U.S. PATENT DOCUMENTS

2008/0054248 A1 * 3/2008 Chua et al. .................... 257/14

OTHER PUBLICATIONS

Kida et al., "Metalorganic Vapor Phase Epitaxy Growth and Study of Stress in AlGaN Using Epitaxial AlN as Underlying Layer", Jpn. J. Appl. Phys, vol. 42 (2003), pp. 572-574 (w/Abstract).*

* cited by examiner

*Primary Examiner*—N Drew Richards
*Assistant Examiner*—Mamadou Diallo
(74) *Attorney, Agent, or Firm*—Burr & Brown

(57) ABSTRACT

There is provided a method for preparing an AlGaN crystal layer having an excellent surface flatness. A buffer layer effective in stress relaxation is formed on a template substrate having a surface layer that is flat at a substantially atomic level and to which in-plane compressive stress is applied, and an AlGaN layer is formed on the buffer layer, so that an AlGaN layer can be formed that is flat at a substantially atomic level. Particularly when the surface layer of the template substrate includes a first AlN layer, a second AlN layer may be formed thereon at a temperature of 600° C. or lower, while a mixed gas of TMA and TMG is supplied in a TMG/TMA mixing ratio of 3/17 or more to 6/17 or less, so that a buffer layer effective in stress relaxation the can be formed in a preferred manner.

16 Claims, 2 Drawing Sheets

FIG. 3

| SAMPLE NO. | 1 | 2 | 3 | 4 | 5 |
|---|---|---|---|---|---|
| PRESENCE OR ABSENCE OF SECOND AlN LAYER | ABSENT | PRESENT | PRESENT | PRESENT | PRESENT |
| TMG/TMA MIXING RATIO | — | 0/17 | 3/17 | 6/17 | 9/17 |
| FORMATION OF MIRROR SURFACE | × | × | ○ | ○ | ○ |
| SURFACE CRACKS | ABSENT | ABSENT | ABSENT | ABSENT | PRESENT |
| SURFACE ROUGHNESS ra | 10 nm OR MORE | 10 nm OR MORE | 5nm | 1nm | 1nm |

METHOD FOR FORMING ALGAN CRYSTAL LAYER

BACKGROUND OF THE INVENTION

1. Field of the Invention

The invention relates to techniques for forming an AlGaN crystal layer on an AlN template substrate.

2. Description of the Background Art

There is a known technique for fabricating a template substrate (epitaxial substrate) that may be used as a base substrate in the process of epitaxially forming a Group III nitride crystal layer (see for example Japanese Patent Application Laid-Open (JP-A) No. 2006-332570).

It is also known that a diode structure-type light-emitting device having an emission wavelength in the ultraviolet region is obtained by forming a light-emitting layer or an n-type or p-type conductive layer of high-Al-content $Al_xGa_{1-x}N$ ($x \geqq 0.4$) (see for example "III-Nitride UV Devices," M. Asif Khan, M. Shatalov, H. P. Maruska, H. M. Wang, and E. Kuokstis, Jpn. J. Appl. Phys., Vol. 44, No. 10, 2005, pp. 7191-7206).

In order to prepare a light-emitting device having an emission wavelength in the deep ultraviolet region as disclosed in the article of Khan et al., it is necessary to form laminations of a plurality of crystal layers made of high-Al-content $Al_xGa_{1-x}N$ ($x \geqq 0.4$) on a single crystal substrate of sapphire or SiC. In order to obtain the light-emitting device with good characteristics, the lamination should be formed in a good manner, and therefore each crystal layer is required to have a good surface flatness.

JP-A No. 2006-332570 discloses that a template substrate having a crystal layer with improved surface flatness can be obtained by a process that includes forming a crystal layer made of Group III nitride such as an AlN as a surface layer on a single crystal base material and then performing a heat treatment at a temperature higher than the temperature at which the crystal layer is formed. However, the inventors have found that when a high-Al-content AlGaN layer as disclosed in the article of Khan et al. is formed using a template substrate having the AlN surface layer, the resulting AlGaN layer does not always have a good surface flatness, although it has a good crystallinity.

In addition, the article of Khan et al. also discloses an aspect that in order to prevent cracking, a multilayered buffer layer is formed before the high-Al-content AlGaN layer is formed. In this case, however, crystal layers having a good surface flatness also cannot be obtained.

SUMMARY OF THE INVENTION

The present invention is intended for a method of forming an AlGaN crystal layer on an AlN template substrate.

A first aspect of the present invention is directed to a method of forming an AlGaN crystal layer comprises the steps of fabricating a template substrate by forming a first AlN layer on a specific single crystal base material, forming a second AlN layer on the first AlN layer, and forming an AlGaN layer on the second AlN layer, wherein the first AlN layer is formed so as to have a flat surface at a substantially atomic level and to be applied an in-plane compressive stress in the step of forming the first AlN layer, the second AlN layer is formed such that the in-plane compressive stress is relaxed as compared with the first AlN layer in the step of forming the second AlN layer and the AlGaN layer is formed at a forming temperature of 1000° C. or higher in the step of forming the AlGaN layer.

Accordingly, a crack-free, high-surface-flatness, AlGaN layer having a flat surface at a substantially atomic level can be formed on a template substrate having a surface layer that is flat at a substantially atomic level and to which an in-plane compressive stress is applied.

A second aspect of the present invention is directed to a method of forming an AlGaN crystal layer includes the steps of fabricating a template substrate by forming a first AlN layer on a specific single crystal base material, forming a second AlN layer on the first AlN layer, and forming an AlGaN layer on the second AlN layer, wherein the first AlN layer is formed so as to have a flat surface at a substantially atomic level and to be applied an in-plane compressive stress in the step of forming the first AlN layer, the second AlN layer is formed at a forming temperature of 600° C. or lower in a Ga-containing atmosphere in the step of forming the second AlN layer, and the AlGaN layer is formed at a forming temperature of 1000° C. or higher in the step of forming the AlGaN layer.

Accordingly, the second AlN layer is formed in a Ga-containing atmosphere so that it can be effective in relaxing the in-plane compressive stress applied on the first AlN layer as the surface layer of the template substrate, even though the second AlN layer has substantially the same composition as the first AlN layer.

Therefore, a crack-free, high-surface-flatness AlGaN layer having a flat surface at a substantially atomic level can be formed on the second AlN layer.

It is therefore an object of the invention to provide a method for fabricating a high-Al-content AlGaN crystal layer with a good surface flatness.

BRIEF DESCRIPTION OF THE DRAWINGS

FIG. 3 shows a list of preparation conditions and the results of the observation of the surface states of the resulting AlGaN layers with respect to sample Nos. 1 to 5.

DETAILED DESCRIPTION OF THE INVENTION

<Outline>

Figure 1:
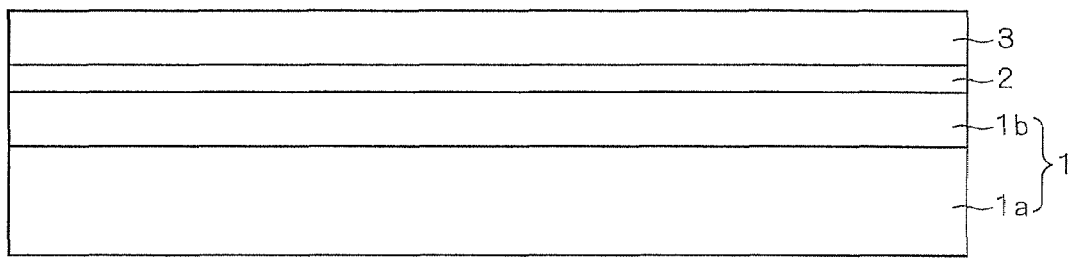
FIG. 1 is a schematic cross-sectional view of a laminated body prepared by a method according to an embodiment of the invention.

FIG. 1 is a schematic cross-sectional view of a laminated body 10 that is produced using a method according to an embodiment of the present invention. The laminated body 10 is simplistically shown a structure that can be a component of various devices such as light-emitting devices and light-receiving devices.

The method according to the present embodiment includes forming a crystal layer 3 made of AlGaN (hereinafter, referred to as AlGaN layer) on a template substrate 1 serving as a base substrate such that the AlGaN layer has good surface flatness. In the present embodiment, a buffer layer 2 is first provided on the template substrate 1 served as a base substrate, and then the AlGaN layer 3 is provided thereon. This realizes the AlGaN layer 3 having such good surface flatness. Here, for the sake of convenience, the ratio between the thicknesses of the respective layers and the aspect ratio shown in FIG. 1 do not reflect the true ratios.

<Template Substrate>

The template substrate 1 has a structure including a base material 1a made of a specific single crystal and a surface layer 1b made of AlN and formed thereon.

The base material 1a is appropriately selected depending on the composition or structure of the surface layer 1b to be formed thereon, and moreover, depending on the method for further forming the crystal layer thereon. For example, a SiC (silicon carbide) substrate, a sapphire substrate or the like may be used as the base material. Alternatively, the single crystal to be used may be appropriately selected from single crystals of various oxide materials such as ZnO, $LiAlO_2$, $LiGaO_2$, $MgAl_2O_4$, $(LaSr)(AlTa)O_3$, $NdGaO_3$, and MgO; single crystals of various Group IV elements such as Si and Ge; single crystals of various Group IV-IV compounds such as SiGe; single crystals of various Group III-V compounds such as GaAs, AlN, GaN, and AlGaN; and single crystals of various boron compounds such as $ZrB_2$. The thickness of the base material 1a is not particularly limited by material. In view of handleability, it is preferably from several hundreds micrometers to several millimeters.

For optical device applications in the ultraviolet region, materials transparent to the operation wavelength are preferably used. In view of compatibility with the crystal structure of Group III nitrides, sapphire is the most preferable as the base material 1a. In addition, for high-power optical device applications, electronic device applications requiring heat radiation, or the like, SiC is the most preferable because of its high thermal conductivity. A material that does not decompose at high temperature should be used depending on the setting temperature of the heat treatment for such as thin film production.

In the present embodiment, a description is given in the case where c-plane sapphire is used as the base material 1a. As described above, however, the base material 1a is not limited to such a material in any way.

The surface layer 1b is generally an epitaxial film made of a Group III nitride crystal formed by a known film forming techniques such as a MOCVD method, a MBE method, a HVPE (a vapor phase epitaxy using a hydride), a sputtering method, and nitriding treatment of the base material. As used herein, the term "Group III nitride crystal" is a crystal represented by the composition formula: $B_xAl_yGa_zIn_{1-x-y-z}N$ (x, y, z≧0) and having a wurtzite structure or a zinc blende structure. The MOCVD method may be used in combination with a PALE (pulsed atomic layer epitaxy) method, a plasma assisted method or a laser assisted method. The MBE method may also be used in combination with the same technique. The growth method such as the MOCVD or MEB method is suited to grow high-quality crystals, because the manufacturing conditions can be precisely controlled. On the other hand, the HVPE method is suited to grow thick films in a short time, because it allows the supply of a large amount of raw materials at once. Upon forming the surface layer 1b, these methods may also be used in combination.

The thickness of the surface layer 1b is not particularly limited and may be selected to be optimal for the structure or use mode of the device being finally applied. For example, it is assumed that the thickness may be from several nanometers to several millimeters. In a preferred example, the surface layer is formed with a thickness of several micrometers. In addition, the composition of the surface layer 1b is not necessarily required to be uniform over the layer. For example, the surface layer may have a gradient composition, or a stress relaxation layer with a different composition may be incorporated in the surface layer.

Moreover the surface layer 1b may contain an impurity inevitably included in the process of forming the surface layer 1b, such as H, C, O, Si, and a transition metal, or may contain an impurity intentionally introduced for electrical conductivity control, such as Si, Ge, Be, Mg, Zn, and Cd.

In the present embodiment, a description is given of an example where the surface layer 1b made of AlN is formed by an MOCVD method. The detail of the formation method will be described later. A single crystal layer made of AlN is formed on the base material 1a at a substrate temperature of 1100° C. or higher by an MOCVD method, and then the single crystal layer (more strictly, the whole of the template substrate 1 provided with the crystal layer) is heat-treated to give the surface layer 1b. The surface layer 1b is also referred to as a first AlN layer.

Such heat treatment is performed so as to improve the crystal quality of the surface layer 1b formed on the base material 1a using the regularity of the crystal alignment of the base material 1a, which is a single crystal. Therefore, it is preferred that the base material 1a should not decompose or melt in the temperature range of the heat treatment carrying out for the improvement of the crystal quality or should not strongly react with the Group III nitride crystal that forms the surface layer 1b, because it is necessary to avoid disturbing the crystal alignment of the base material 1a during the heat treatment. Therefore, it is preferred that a reaction product between the base material 1a and the surface layer 1b should not be significantly formed at the interface therebetween during the heat treatment. Specifically, a reaction product is not significantly formed means that the reaction product is not present at all at the interface therebetween after the heat treatment or even if present, the thickness of the reaction product is at most 1/10 or less of the thickness of the surface layer 1b. If the thickness of the reaction product is more than such a value, there is a possibility that the existing reaction product could degrade the surface flatness of the surface layer 1b. Therefore, overall or localized formation of a very thin reaction product at the interface between the base material 1a and the surface layer 1b by heat treatment is not excluded from the scope of the invention. In some cases, such a very thin reaction product may preferably be present, because it can play a role as a buffer layer for a reduction in dislocation or the like. From this point of view, sapphire, MgO or SiC having a high melting point is preferable as the base material 1a.

The heat treatment is also particularly effective in reducing dislocation or eliminating pits on the surface. For example, the dislocation density can be reduced to about ½ or less. In particular, an edge dislocation can be effectively incorporated and eliminated.

After the heat treatment, the surface of the template substrate 1 (namely the surface of the surface layer 1b) is visually observed as a mirror surface with no cracks and has a good surface flatness at a substantially atomic level in such a degree that the surface roughness ra of a 5 square micrometers area is several nanometers or so in the measurement with an AFM (atomic force microscope). However, it has been confirmed that the in-plane lattice constant of AlN is smaller in the surface layer 1b (first AlN layer) after the heat treatment than in an ideal state with no stress, namely that in-plane compressive stress is applied to the surface layer.

<Buffer Layer>

A buffer layer 2 is provided such that the AlGaN layer 3 can be formed thereon with good surface flatness.

The buffer layer 2 satisfying the object can be achieved by forming a crystal layer mainly composed of AlN with a very small thickness of 10 nm or less, for example, by an MOCVD method at a low temperature of 600° C. or less. In the present embodiment, the buffer layer formed in this manner is also referred to as a second AlN layer.

Here, in this case, a crystal layer "mainly" composed of AlN means that the resulting AlN layer is more likely to contain a small amount of Ga atom as an impurity due to the process for forming the crystal layer described later. The detail will be described later, when the second AlN layer serving suitably as the buffer layer 2 is formed by an MOCVD method, it is necessary to supply a mixed gas including not only TMA (trimethylaluminum) gas, which is generally used as an Al source, but also TMG (trimethylgallium) gas in a specific mixing ratio. However, it is AlN that is formed, not AlGaN containing Al and Ga in a ratio corresponding to the mixing ratio (flow ratio) of each gas in a mixed gas. It is considered, therefore, that the second AlN layer can be contaminated with a small amount of Ga. In other words, it is necessary that the second AlN layer has to be formed in a Ga atom-containing atmosphere.

The in-plane compressive stress, which is applied to the surface of the first AlN layer, is relaxed in the surface of the second AlN layer. More specifically, the stress relaxation is achieved on the basis that the second AlN layer is not homoepitaxially grown, namely not matching to the crystal lattice of the first AlN layer, but is formed as a crystal layer having an in-plane lattice constant larger than that of AlN forming the first AlN layer, although the second AlN layer is formed on the surface of the first AlN layer which is flat at a substantially atomic level (at such a level that an atomic step is observed) by a material of the substantially same composition. This may be because the second AlN layer is formed with a very small thickness at a low temperature of 600° C. or less which can cause insufficient growth of the Group III nitride crystal (only the formation of a crystal whose crystallinity is remarkably lower than that of the first AlN layer).

Here, the crystallinity of the second AlN layer is made better than the original crystallinity in the process of heating to a specific temperature at which the AlGaN layer 3 is subsequently formed or by heat treatment (described later) performed prior to the heating. However, the stress on the second AlN layer is kept relaxed, and the AlGaN layer 3 is formed on the buffer layer 2 where the in-plane compressive stress is relaxed.

It will be understood that the buffer layer 2 may be formed by other than the second AlN layer, as long as it is effective in relaxing the in-plane compressive stress applied to the surface layer 1b.

Moreover, before the buffer layer is formed after the heat treatment, an AlN layer may be homoepitaxially grown at a temperature of 1100° C. or higher temporarily in order to improve the surface flatness degraded by the heat treatment.

<AlGaN Layer>

The AlGaN layer 3 is formed on the buffer layer 2. More strictly, the AlGaN layer 3 is a crystal layer represented by the composition formula: $Al_xGa_{1-x}N$ ($0 \leq x \leq 1$). The AlGaN layer 3 is not necessarily to be formed as a single crystal layer as shown in FIG. 1 and may be formed as a laminate of a plurality of crystal layers of the same or different compositions (in other words, with different x values) depending on the function to be exerted by the device that is achieved using the laminated body 10 as a component. Alternatively, the AlGaN layer 3 may be appropriately doped with an acceptor element or a donor element so as to have p-type or n-type conductivity. In addition, the thickness of the AlGaN layer 3 may be appropriately determined depending on the required function.

In the present embodiment, the AlGaN layer 3 is formed on the buffer layer 2 as described above and therefore has a good surface flatness. For example, the AlGaN layer 3 may be formed such that the surface thereof is visually observed as a mirror surface with no cracks and has a good surface flatness in such a degree that the surface roughness ra of a 5 square micrometers area is several nanometers or so in the measurement with an AFM (atomic force microscope).

<Process for Forming AlGaN Layer>

Next, a description is given of a process for forming the AlGaN layer having a good surface flatness as described above. In this section, a description is given in a case where the template substrate 1 consists of a c-plane sapphire single crystal as the base material 1a and the first AlN layer formed thereon as the surface layer 1b, and the second AlN layer as the buffer layer 2 is formed on the template substrate 1.

First, the template substrate 1 is obtained. The template substrate 1 may be prepared by a known technique. For example, a several hundreds μm c-plane sapphire single crystal is provided as the base material 1a, placed at a specific position in an MOCVD apparatus, and heated at a temperature of 1100° C. or higher, then TMA and ammonia gas are supplied in a specific flow ratio together with hydrogen carrier gas, so that AlN layer with a thickness of several μm is formed. Here, in the description below, the term "temperature" refers to the temperature of the base material 1a.

In a known heat-treatment furnace, the laminated body of the base material 1a and the AlN layer is then subject to heat treatment heating to a temperature of 1600° C. or higher. The heating may be performed in the MOCVD apparatus. The heat treatment allows the formation of the surface layer 1b where surface has a substantially atomic level of flatness and to which in-plane compressive stress is applied. As a result, the template substrate 1 is obtained.

Here, the heat treatment is preferably performed in a temperature range not higher than the melting point of the base material 1a or in a temperature range where a reaction product is not remarkably formed between the base material 1a and the surface layer 1b, namely in a temperature range where crystal quality degradation of the surface layer 1b due to an excessive reaction does not occur. In this embodiment, a c-plane sapphire is used as the base material 1a, and the surface layer 1b is formed of AlN. Therefore, the heat treatment is preferably performed in a temperature range where γ-ALON is not remarkably formed at the interface therebetween. If γ-ALON is remarkably formed, the surface of the surface layer 1b can be roughened so that it can be difficult to form the AlGaN layer with a good surface flatness, even though the buffer layer 2 is provided.

Regarding an atmosphere during the heat treatment, it is preferable that the atmosphere contains nitrogen element in order to prevent the decomposition of AlN. For example, an atmosphere containing nitrogen gas or ammonia gas may be used. Regarding pressure conditions at the time of the heat treatment, it has been confirmed that any pressure from reduced pressure to increased pressure may be used to improve the crystal quality of the AlN layer.

Figure 2:
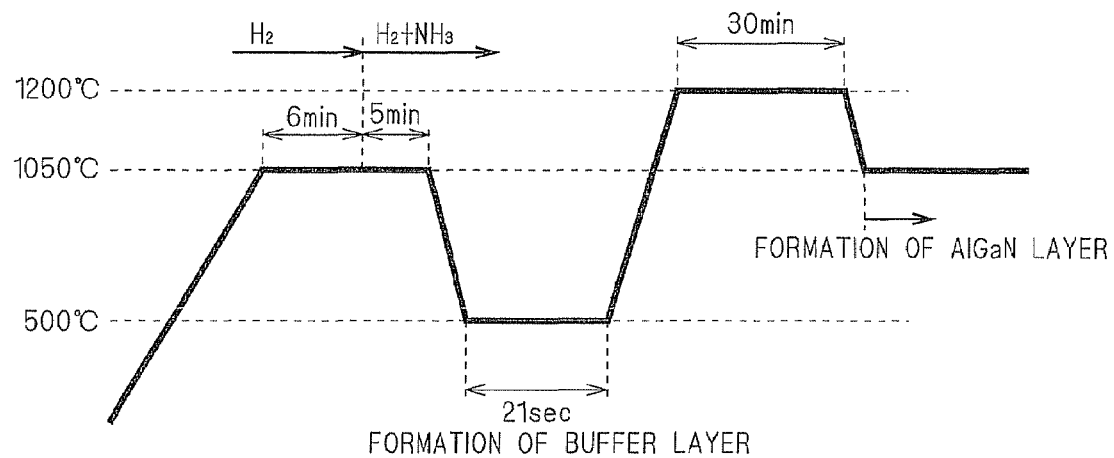
FIG. 2 is a diagram illustrating a temperature history for a process including forming a buffer layer and an AlGaN layer sequentially on a template substrate.

The buffer layer 2 and the AlGaN layer 3 are sequentially formed on the template substrate 1 which has been heat-treated. FIG. 2 is a diagram showing a temperature history for the process of forming these layers.

First, the template substrate 1 is placed at a specific position in an MOCVD apparatus and heated at a temperature of about 1050° C. to about 1100° C. (1050° C. in FIG. 2), while only hydrogen gas is supplied. After the temperature is maintained for several minutes (6 minutes in FIG. 2), hydrogen gas and ammonia gas are further supplied, and the supply is maintained for several minutes (5 minutes in FIG. 2). While the supply state is maintained, the temperature is then lowered to 500° C. The temperature rise process is performed to remove the surface oxide film formed on the surface of the template substrate 1. Here, the total time by which the temperature reaches 500° C. is preferably set at several tens minutes (for example, about 30 minutes).

When the temperature reaches 500° C., a mixed gas of TMA and TMG in a specific mixing ratio and ammonia gas are each supplied with a hydrogen carrier gas at a specific flow rate for several tens seconds (21 seconds in FIG. 2). As a result, an AlN layer with a thickness of several nanometers (4 nm in FIG. 2) is formed as the buffer layer 2.

Here, in order to exert the effects of the invention, it is important to simultaneously supply TMG and TMA. The mixing ratio of TMG to TMA is preferably set at a specific value in the range of 3/17 or more to 6/17 or less. If the mixing ratio is set in this range, the AlGaN layer 3 can be reliably formed with a good surface flatness. Namely, this means that if the mixing ratio is in the above range, an AlN layer highly exerts an effective of the stress relaxation can be formed as the buffer layer 2.

After the buffer layer 2 is formed, the temperature is temporarily raised to 1200° C. and held for several tens minutes (30 minutes in FIG. 2). This process is performed to improve the crystallinity of the second AlN layer formed as the buffer layer 2.

The temperature is then lowed to a forming temperature for AlGaN layer 3 (1050° C. in FIG. 2). At the temperature is reached the forming temperature, a mixed gas of TMA and TMG in a specific mixing ratio and ammonia gas are each supplied with a hydrogen carrier gas at a specific flow rate so that the AlGaN layer 3 of the desired composition with a specific thickness is formed. Since the buffer layer 2 is formed in a preferred manner, the resulting AlGaN layer 3 has a mirror surface with no cracks observed and also has a good surface flatness at such a level that its surface roughness ra is several nanometers.

Here, it may be an aspect that the mixing ratio between TMA and TMG may be gradually or continuously changed so that the AlGaN layer 3 may be formed with a multilayer structure of different compositions or with a gradient composition. Alternatively, the AlGaN layer 3 may be doped with an acceptor element or a donor element at appropriate timing so as to partially or entirely have p-type or n-type conductivity.

If the mixing ratio of TMG to TMA is more than 6/17, for example, set at 9/17, in the process of forming the second AlN layer, cracks can be observed on the surface of the resulting AlGaN layer 3, although the AlGaN layer 3 can have a mirror surface with a surface roughness ra of 1 nm. This means that if the mixing ratio of TMG is high, the AlN layer having the stress-relaxation effect cannot be well formed.

On the other hand, when only TMA is supplied in the same manner without mixing TMG in the process of forming the second AlN layer, the AlGaN layer 3 formed thereon has hexagonal cylinder-shaped irregularities and also has a surface roughness ra of 10 nm or more, although no cracks are observed on its surface. Here, when the second AlN layer itself is not formed and when the AlGaN layer 3 is formed directly on the template substrate 1, it has been confirmed that hexagonal cylinder-shaped surface irregularities are similarly formed with a surface roughness ra of 10 nm or more.

Namely, the surface state of the resulting AlGaN layer 3 is not different between the case where only TMA is supplied in the same manner to form the second AlN layer before the formation of the AlGaN layer 3 and the case where the AlGaN layer 3 is formed without forming the second AlN layer. In other words, this means that when only TMA is supplied without mixing TMG, the surface state of the resulting AlGaN layer 3 is the same as that in the case where substantially no second AlN layer is formed. This may be because when only TMA is supplied to form the second AlN layer, the resulting crystal layer is matching to the crystal lattice of the first AlN layer so that the result can be only the same as in the case where the first AlN layer is only formed. In the case where the mixing ratio of TMG to TMA is less than 3/17, the supply of Ga is also insufficient, and therefore it is considered that the result would not be different from that in the case where only TMA is supplied.

Additionally, it is a result that the difference of the surface state of the AlGaN layer 3 with the mixing ratio between TMA and TMG suggests that the Ga atom supplied from TMG should directly or indirectly contribute to the stress relaxation effect of the second AlN layer.

As described above, according to the present embodiment, a buffer layer effective in stress relaxation is formed on a template substrate having a surface layer that is flat at a substantially atomic level and to which in-plane compressive stress is applied, and an AlGaN layer is formed on the buffer layer, so that the AlGaN layer having a good surface flatness can be formed. Particularly when the surface layer of the template substrate is the first AlN layer, a second AlN layer may be formed thereon at a temperature of 600° C. or less, while a mixed gas of TMA and TMG is supplied, so that a buffer layer effective in stress relaxation can be formed in a preferred manner. Accordingly, a device having, for example, a high-Al-content AlGaN layer as a functional layer can be manufactured in a preferred manner.

EXAMPLES

Buffer layers were formed under different forming conditions on template substrates prepared under the same conditions, respectively (including the case where no buffer layer was formed). AlGaN layers were formed under the same conditions on the different buffer layers, respectively, so that samples (Nos. 1 to 5) were prepared. The surfaces of the samples were each observed. In No. 1, the AlGaN layer was formed on the template substrate with no buffer layer. In Nos. 2 to 5, the feed rate of TMA was 17 μmol/minute, while the feed rate of TMG was 0, 3, 6, or 9 μmol/minute, in the process of forming the buffer layer.

A 400 μm-thick, c-plane, sapphire single crystal was provided as a base material. A 1 μm-thick AlN layer was epitaxially grown on the base material using an MOCVD method and then heat-treated at 1700° C. in nitrogen, so that the template substrate was obtained. It was confirmed that in-plane compressive stress was applied to the surface layer (the first AlN layer) after the heat treatment. The in-plane lattice constant (a) of the first AlN layer was measured to be 3.101 angstroms by X-ray diffraction method and TEM.

The resulting template substrate was placed at a specific position in an MOCVD apparatus and heated to 1100° C., while only hydrogen gas was supplied. After the temperature was held for 6 minutes, hydrogen gas and ammonia gas were further supplied. After the supply was held for 5 minutes, the temperature was lowered. This heating process was performed for 30 minutes, so that a surface oxide film was removed from the surface of the template substrate.

For the samples other then No. 1, the temperature was then lowered to 500° C., while the gas supply state was maintained. When the temperature reached 500° C., TMA and TMG were each supplied at the above feed rate with a hydrogen carrier gas, while ammonia gas was supplied, so that a second AlN layer was formed on each sample. The in-plane lattice constant (a) of the second AlN layer was measured to be 3.109 angstroms by X-ray diffraction method and TEM. Since the in-plane lattice constant of the second AlN layer is larger than that of the first AlN layer, relaxation of the compressive stress may be recognized.

After the surface oxide was removed (for sample No. 1) or after the second AlN layer was formed (for sample Nos. 2 to 5), the film-forming temperature was set at 1050° C., while TMA and TMG were each supplied at a specific feed rate with a hydrogen carrier gas, while ammonia gas was supplied, so that a 0.2 µm-thick, non-doped $Al_{0.6}Ga_{0.4}N$ layer was formed. Subsequently, $SiH_4$ was supplied at a specific feed rate so that a 1.5 µm-thick, Si-doped $Al_{0.6}Ga_{0.4}N$ layer was formed. As a result, an AlGaN layer was obtained. The surface of the resulting AlGaN layer of the sample was visually observed, and the surface roughness ra of a 5 µm square area thereof was measured with an AFM.

FIG. 3 shows a list of preparation conditions and the results of the observation of the surface states of the resulting AlGaN layers with respect to the samples (Nos. 1 to 5).

As shown in FIG. 3, it was confirmed that in sample No. 3 and sample No. 4, the resulting AlGaN layer whose surface was a mirror surface, which had no cracks observed, which had a surface roughness of several nanometers, and which was flat at a substantially atomic level was formed.

On the other hand, in sample No. 1 and sample No. 2, hexagonal cylinder-shaped irregularities were formed, and the surface roughness ra was 10 nm or more, although cracks was not observed on the surface.

In addition, in sample No. 5, cracks were observed on the surface, although the surface was a mirror surface and a surface roughness ra in the mirror surface portion is 1 nm.

Therefore, it has been confirmed that when the mixing ratio of TMG to TMA is from 3/17 or more to 6/17 or less in the process of forming the second AlN layer, AlGaN layers with a good surface flatness are formed and that when the mixing ratio is above or below the range or when the second AlN layer is not formed, AlGaN layers with a good surface flatness are not obtainable.

The invention claimed is:

1. A method for forming an AlGaN crystal layer, comprising the steps of:
    fabricating a template substrate by forming a first AlN layer on a specific single crystal base material;
    forming a second AlN layer at a temperature of 600° C. or lower in a Ga-containing atmosphere on said first AlN layer; and
    forming an AlGaN layer directly on said second AlN layer;
    wherein said first AlN layer is formed so as to have a flat surface at a substantially atomic level and so as to have an applied in-plane compressive stress in the step of forming said first AlN layer;
    wherein said second AlN layer is formed so as to have an applied in-plane compressive stress, that is relaxed compared with said in-plane compressive stress of said first AlN layer, in the step of forming said second AlN layer; and
    wherein said AlGaN layer is formed at a forming temperature of 1000° C. or higher in the step of forming said AlGaN layer.

2. A method for forming an AlGaN crystal layer, comprising the steps of:
    fabricating a template substrate by forming a first AlN layer on a specific single crystal base material;
    forming a second AlN layer at a temperature of 600° C. or lower in a Ga-containing atmosphere on said first AlN layer; and
    forming an AlGaN layer at a temperature of 1000° C. or higher directly on said second AlN layer;
    wherein said first AlN layer is formed so as to have a flat surface at a substantially atomic level and so as to have an applied in-plane compressive stress in the step of forming said first AlN layer.

3. The method for forming an AlGaN crystal layer according to claim 2, wherein the step of forming said second AlN layer comprises supplying a mixed gas of trimethylaluminum and trimethylgallium in a trimethylgallium/trimethylaluminum mixing ratio of a specific range of 3/17 or more to 6/17 or less to form said second AlN layer in said Ga-containing atmosphere.

4. The method for forming an AlGaN crystal layer according to claim 1, wherein the step of forming said first AlN layer comprises the steps of:
    epitaxially forming said first AlN crystal layer on said single crystal base material; and
    heating said first AlN crystal layer at said temperature of 1500° C. or higher, so that said first AlN crystal layer, after said heating, has a flat surface at a substantially atomic level.

5. A method for forming an AlGaN crystal layer on a template substrate having a first AlN layer as a surface layer that has a flat surface at a substantially atomic level and to which an in-plane compressive stress is applied, comprising the steps of:
    forming a second AlN layer on said first AlN layer defining the surface layer of said template substrate; and
    forming an AlGaN layer directly on said second AlN layer;
    wherein said second AlN layer is formed at a forming temperature of 600° C. or less in a Ga-containing atmosphere in the step of forming said second AlN layer;
    wherein said second AlN layer is formed so that an applied in-plane compressive stress is relaxed compared with the applied in-plane compressive stress of said first AlN layer; and
    wherein said AlGaN layer is formed at a forming temperature of 1000° C. or higher in the step of forming said AlGaN layer.

6. A method for forming an AlGaN crystal layer on a template substrate having a first AlN layer as a surface layer that has a flat surface at a substantially atomic level and to which an in-plane compressive stress is applied, comprising the steps of:
    forming a second AlN layer on said first AlN layer defining the surface layer of said template substrate; and
    forming an AlGaN layer directly on said second AlN layer;
    wherein said second AlN layer is formed at a forming temperature of 600° C. or less in a Ga-containing atmosphere in the step of forming said second AlN layer; and
    wherein said AlGaN layer is formed at a forming temperature of 1000° C. or higher in the step of forming said AlGaN layer.

7. The method for forming an AlGaN crystal layer according to claim 6, wherein the step of forming said second AlN layer comprises supplying a mixed gas of trimethylaluminum and trimethylgallium in a trimethylgallium/trimethylaluminum mixing ratio of a specific range of 3/17 or more to 6/17 or less to form said second AlN layer in said Ga-containing atmosphere.

8. The method for forming an AlGaN crystal layer according to claim 5, wherein said template substrate is prepared by a process comprising the steps of:
  epitaxially forming said first AlN crystal layer on a specific single crystal base material; and
  heating said first AlN crystal layer at said temperature of 1500° C. or higher, so that said first AlN crystal layer, after said heating, has a flat surface at a substantially atomic level.

9. The method for forming an AlGaN crystal layer according to claim 1, further comprising the step of heat-treating a laminated body comprising said template substrate and said second AlN layer at a temperature higher than the forming temperature at which said AlGaN layer is formed, prior to the step of forming said AlGaN layer.

10. The method for forming an AlGaN crystal layer according to claim 1, wherein the step of forming said second AlN layer comprises supplying a mixed gas of trimethylaluminurn and trimethylgallium in a trimethylgalliurn/trimethylaluminum mixing ratio of a specific range of 3/17 or more to 6/17 or less to form said second AlN layer in a Ga-containing atmosphere.

11. The method for forming an AlGaN crystal layer according to claim 2, wherein the step of forming said first AlN layer comprises the steps of:
  epitaxially forming said first AlN crystal layer on said single crystal base material; and
  heating said first AlN crystal layer at said temperature of 1500° C. or higher, so that said first AlN crystal layer, after said heating, has a flat surface at a substantially atomic level.

12. The method for forming an AlGaN crystal layer according to claim 2, further comprising the step of heat-treating a laminated body comprising said template substrate and said second AlN layer at a temperature higher than the forming temperature at which said AlGaN layer is formed, prior to the step of forming said AlGaN layer.

13. The method for forming an AlGaN crystal layer according to claim 5, wherein the step of forming said second AlN layer comprises supplying a mixed gas of trimethylaluminum and trimethylgallium in a trimethylgallium/trimethylaluminuin mixing ratio of a specific range of 3/17 or more to 6/17 or less to form said second AlN layer in a Ga-containing atmosphere.

14. The method for forming an AlGaN crystal layer according to claim 5, further comprising the step of heat-treating a laminated body comprising said template substrate and said second AlN layer at a temperature higher than the forming temperature at which said AlGaN layer is formed, prior to the step of forming said AlGaN layer.

15. The method for forming an AlGaN crystal layer according to claim 6, wherein said template substrate is prepared by a process comprising the steps of:
  epitaxially forming said first AlN crystal layer on a specific single crystal base material; and
  heating said first AlN crystal layer at said temperature of 1500° C. or higher, so that said first AlN crystal layer, after said heating, has a flat surface at a substantially atomic level.

16. The method for forming an AlGaN crystal layer according to claim 6, further comprising the step of heat-treating a laminated body comprising said template substrate and said second AlN layer at a temperature higher than the forming temperature at which said AlGaN layer is formed, prior to the step of forming said AlGaN layer.

* * * * *

UNITED STATES PATENT AND TRADEMARK OFFICE
CERTIFICATE OF CORRECTION

PATENT NO. : 7,632,741 B2  Page 1 of 1
APPLICATION NO. : 12/051138
DATED : December 15, 2009
INVENTOR(S) : Kei Kosaka et al.

It is certified that error appears in the above-identified patent and that said Letters Patent is hereby corrected as shown below:

Title, Item (54) & Column 1, Line 1
    please change "METHOD FOR FORMING ALGAN CRYSTAL LAYER" to
--METHOD OF FORMING AlGaN CRYSTAL LAYER--

Column 10
    Line 18: please change "minurn" to --minum--
    Line 32: please change "fiat" to --flat--

Column 11
    Line 21: please change "trimethylaluminurn" to --trimethylaluminum--
    Line 22: please change "trimethylgalliurn" to --trimethylgallium--

Column 12
    Line 11: please change "minuin" to --minum--

Signed and Sealed this

Thirteenth Day of July, 2010

David J. Kappos
*Director of the United States Patent and Trademark Office*